US008927375B2

(12) United States Patent
Alptekin et al.

(10) Patent No.: US 8,927,375 B2
(45) Date of Patent: Jan. 6, 2015

(54) FORMING SILICON-CARBON EMBEDDED SOURCE/DRAIN JUNCTIONS WITH HIGH SUBSTITUTIONAL CARBON LEVEL

(71) Applicants: International Business Machines Corporation, Armonk, NY (US); STMicroelectronics, Inc., Coppell, TX (US)

(72) Inventors: Emre Alptekin, Wappingers Falls, NY (US); Abhishek Dube, Belmont, CA (US); Henry K. Utomo, Newburgh, NC (US); Reinaldo A. Vega, Wappingers Falls, NY (US); Bei Liu, Fishkill, NY (US)

(73) Assignees: International Business Machines Corporation, Armonk, NY (US); STMicroelectronics, Coppell, TX (US)

( * ) Notice: Subject to any disclaimer, the term of this patent is extended or adjusted under 35 U.S.C. 154(b) by 270 days.

(21) Appl. No.: 13/646,754

(22) Filed: Oct. 8, 2012

(65) Prior Publication Data
US 2014/0099763 A1    Apr. 10, 2014

(51) Int. Cl.
*H01L 21/336*    (2006.01)

(52) U.S. Cl.
USPC ................. 438/300; 438/530; 257/E21.09

(58) Field of Classification Search
USPC ............................ 438/300, 530; 257/E21.09
See application file for complete search history.

(56) References Cited

U.S. PATENT DOCUMENTS

| 7,279,758 | B1 | 10/2007 | Li et al. | |
| 2006/0234455 | A1 | 10/2006 | Chen et al. | |
| 2007/0238267 | A1 | 10/2007 | Liu et al. | |
| 2009/0068824 | A1* | 3/2009 | Liu et al. | 438/530 |
| 2009/0181508 | A1* | 7/2009 | Holt et al. | 438/285 |
| 2012/0068193 | A1* | 3/2012 | Chan et al. | 257/77 |

OTHER PUBLICATIONS

Koh, et al., N-Channel MOSFETs with Embedded Silicon-Carbon Source/Drain Stressors Formed Using Cluster-Carbon Implant and Excimer-Laser-Induced Solid Phase Epitaxy, IEEE Electron Device Letters, vol. 29, No. 12, Dec. 2008 pp. 1315-1318.

Liu, et al., Strained Si Channel MOSFETs with Embedded Silicon Carbon Formed by Solid Phase Epitaxy, 2007 Symposium on VLSI Technology Digest of Technical Papers, pp. 44-45.

Itokawa, et al., Carbon Incorporation into Substitutional Silicon Site by Carbon Cryo Ion Implantation and Metastable Recrystallization Annealing as Stress Technique in n-Metal-Oxide-Semiconductor Field-Effect Transistor, 2010 IEEE.

* cited by examiner

*Primary Examiner* — Daniel Whalen
(74) *Attorney, Agent, or Firm* — Yuanmin Cai; Joseph Petrokaitis

(57) ABSTRACT

Embodiment of the present invention provides a method of forming a semiconductor device. The method includes providing a semiconductor substrate; epitaxially growing a silicon-carbon layer on top of the semiconductor substrate; amorphizing the silicon-carbon layer; covering the amorphized silicon-carbon layer with a stress liner; and subjecting the amorphized silicon-carbon layer to a solid phase epitaxy (SPE) process to form a highly substitutional silicon-carbon film. In one embodiment, the highly substitutional silicon-carbon film is formed to be embedded stressors in the source/drain regions of an nFET transistor, and provides tensile stress to a channel region of the nFET transistor for performance enhancement.

20 Claims, 10 Drawing Sheets

FORMING SILICON-CARBON EMBEDDED SOURCE/DRAIN JUNCTIONS WITH HIGH SUBSTITUTIONAL CARBON LEVEL

FIELD OF THE INVENTION

The present invention relates to the field of semiconductor device manufacturing. In particular, it relates to method of forming highly substitutional epitaxial silicon-carbon films and devices having such films.

BACKGROUND

In the field of semiconductor device manufacturing, active semiconductor devices such as, for example, transistors are manufactured through processes commonly known as front end of line (FEOL) technology. Such transistors may include, inter alia, a field-effect-transistor (FET) which may be more specifically, as one un-limiting example, a complementary metal-oxide-semiconductor FET or CMOS-FET. Moreover, a FET may be a p-type dopant doped FET (pFET) or an n-type dopant doped FET (nFET). Different types of transistors may be manufactured on a common semiconductor substrate or semiconductor chip.

It is known in the art that performance of semiconductor transistors, including those described above, may be greatly improved through means of enhancing mobility of electrons or holes, depending on the type of the transistors, in the channel region of the transistors. For example, it is known in the art that uniaxial tensile stress may enhance electron mobility in certain types of doped silicon (Si) and therefore may be used to improve or enhance drive current of an nFET transistor. In order to achieve uniaxial tensile stress in the channel region of an nFET transistor, one common approach is through the formation of a silicon-carbon (Si:C) film or Si:C layer, in the form of stressors, in the source/drain regions of the nFET transistor. In other words, the approach forms embedded Si:C stressors in the source/drain regions of the nFET transistor. This is an approach similar to a complementary process of applying embedded silicon-germanium (e-SiGe) source/drain to improve performance of a pFET transistor over the years.

There are two well known approaches to achieve or to form Si:C source/drain stressors: one is through chemical vapor deposition (CVD) of cyclic epitaxial Si:C layers and the other is through solid phase epitaxy (SPE) after a self amorphizing carbon (C) implantation or, in other words, through amorphizing C implantation which is followed by a thermal annealing step to cause re-crystallization of silicon. However, both approaches have their respective drawbacks. For example, unlike e-SiGe deposition that is used in enhancing pFET transistor performance, in order to achieve robust selectivity relative to surrounding isolating/insulating materials such as nitride, oxide, and/or oxynitride, such that to form Si:C epitaxial film only in designated source/drain regions of the nFET transistor with highly substitutional carbon level (for example, more than 1.5% carbon in atomic concentration) in the formed Si:C film, a low temperature and cyclic CVD deposition process is required. The deposition needs to be carried out at the relatively low temperature (below or near 600 C) because carbon is highly unstable in Si lattice, and the cyclic deposition is required due to the low solid solubility of carbon. As a result, the CVD deposition process generally has a low growth rate and thus low throughput. Furthermore, achieving facetless epitaxial growth, which is important in forming low-resistant contact, under these conditions is often found difficult.

On the other hand, Si:C formation by amorphizing C implantation followed by a SPE process has a couple of drawbacks as well. For example, in order to achieve maximum stress benefit, Si:C layer should be formed at some certain depth (e.g. around 30 to 40 nm) below the channel level of the nFET transistor. However, with C being a low mass atom the implantation may create a significant implant tail, hence the gate height will limit the maximum C implant energy in order not to cause gate punch-through, which in-turn limits the depth of Si:C layer achievable. This may become a serious issue for short channel devices and cause defective re-crystallization in embedded source-drain region. Even though one may be able to approximate the Si:C layer by using several different C implants with different energy levels, it becomes very difficult to achieve true box-shape like Si:C profile, which is generally desirable for achieving optimum stress effect.

SUMMARY

Embodiments of the present invention provide a method of forming silicon-carbon (Si:C) source/drain stressors for nFET transistors. The method includes performing solid phase epitaxy of an amorphized Si:C layer which may be grown epitaxially, followed by an elemental, cluster, or other carbon-containing species implantation and a stress liner (preferably a tensile liner) encapsulation.

More generally, embodiments of the present invention provide a method of forming semiconductor structures. The method includes providing a semiconductor substrate; epitaxially growing a silicon-carbon layer on top of the semiconductor substrate; amorphizing the silicon-carbon layer; covering the amorphized silicon-carbon layer with a stress liner; and subjecting the amorphized silicon-carbon layer to a solid phase epitaxy (SPE) process.

In one embodiment, epitaxially growing the silicon-carbon layer includes depositing the silicon-carbon layer in a non-cyclic process performed at a temperature higher than about 600 C degrees. In another embodiment, the silicon-carbon layer is deposited at a temperature range between about 650 C and about 800 C degrees.

In another embodiment, amorphizing the silicon-carbon layer includes breaking bonds between carbon (C) and silicon (Si) through ion-implantation, wherein ions implanted during the amorphizing include at least one of germanium (Ge), xenon (Xe), and silicon (Si).

In yet another embodiment, subjecting the amorphized silicon-carbon layer to the SPE process includes exposing the silicon-carbon layer, while being covered by the stress liner, to a thermal annealing process at a temperature of approximately 600 degree C. that lasts for about 30 seconds.

In a further embodiment, subjecting the amorphized silicon-carbon layer to the SPE process re-crystallizes the silicon-carbon layer and results in a highly substitutional silicon-carbon film having a carbon atomic concentration of larger than 1.5%.

Embodiments of present invention provide a method of forming a field-effect-transistor. The method includes providing a semiconductor substrate; forming a gate structure of the field-effect-transistor on top of the semiconductor substrate, the gate structure having nitride spacers at sidewalls thereof; creating recesses in the semiconductor substrate next to the gate structure adjacent to the nitride spacers; epitaxially growing a silicon-carbon layer in the recesses; amorphizing the silicon-carbon layer; covering the amorphized silicon-carbon layer with a stress liner; and subjecting the amorphized silicon-carbon layer to a solid phase epitaxy (SPE) process.

Embodiments of present invention provide a method of forming a field-effect-transistor. The method includes providing a semiconductor substrate; forming at least one gate structure on top of the semiconductor substrate, the gate structure having at least one set of spacers at sidewalls thereof, the set of spacers being adjacent to source/drain regions of the field-effect-transistor; epitaxially growing a silicon-carbon layer on top of the semiconductor substrate; amorphizing the silicon-carbon layer; depositing a stress liner covering the amorphized silicon-carbon layer; and subjecting the amorphized silicon-carbon layer to a thermal annealing process, and transform the amorphized silicon-carbon layer into a highly substitutional silicon-carbon film.

BRIEF DESCRIPTION OF THE DRAWINGS

The invention will be understood and appreciated more fully from the following detailed description of preferred embodiments, taken in conjunction with the accompanying drawings of which.

Figure 1:
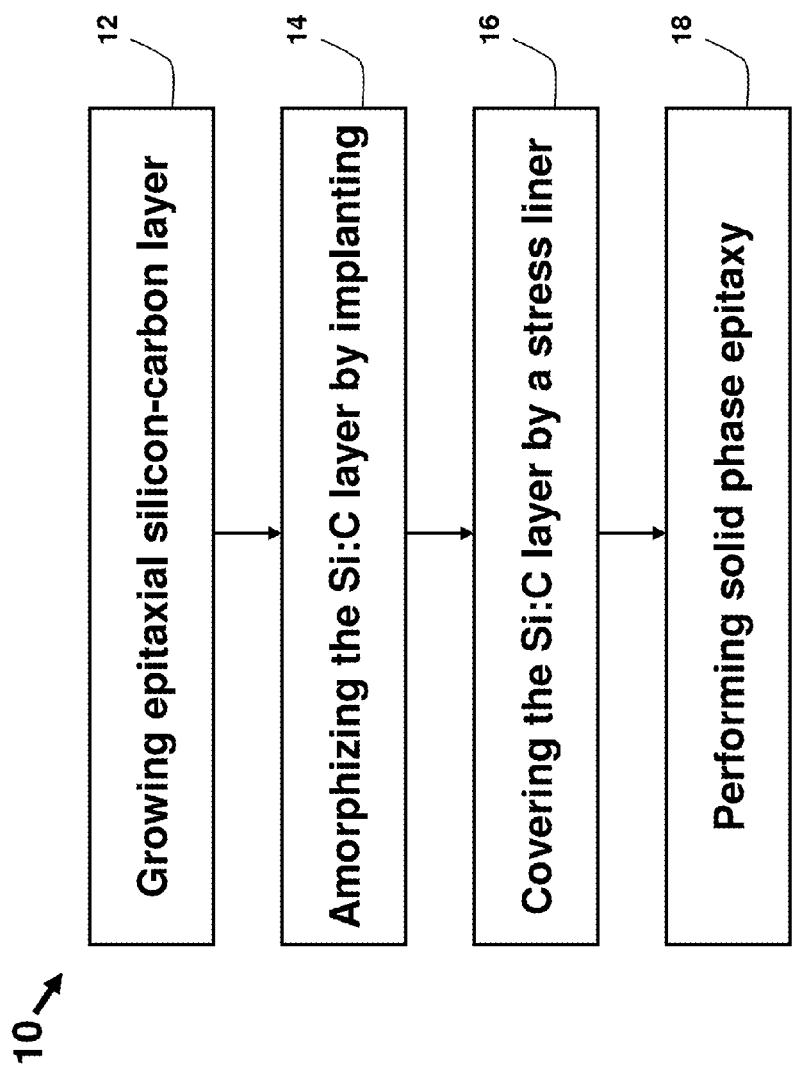
FIG. 1 is a demonstrative flow-chart illustration of a method of forming epitaxial silicon-carbon film according to one embodiment of the present invention.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF PREFERRED EMBODIMENTS

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the present invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or patent applications for reference in order not to obscure description of essences and/or embodiments of the present invention. It is to be understood that the following descriptions have rather focused on distinctive features and/or elements of various embodiments of the invention.

The present invention provides a method of forming a silicon-carbon (Si:C) epitaxial layer or film and in particular a highly substitutional Si:C epitaxial film, which may be used in the formation of source/drain of an nFET transistor for enhanced performance thereof. As will be described below in more details, embodiments of the present invention include applying, preferably but not limited to, a non-cyclic epitaxial growing step to first form an epitaxial silicon-carbon film or layer, which is then followed by, according to one embodiment, a pre-amorphization implant step, a stress liner encapsulation step, and a solid phase epitaxy (SPE) step to transform the initial epitaxial silicon-carbon film into a highly substitutional Si:C film.

Embodiments of present invention do not require or make it necessary to grow fully or highly substitutional Si:C film during the initial non-cyclic (or cyclic) epitaxial process. Therefore, unlike currently existing processes, embodiments of present invention are able to grow epitaxial film at a temperature that is generally higher than those conventional ones, resulting in high growth rate of the Si:C film and better throughput. Moreover, because of the high growth temperature used, a non-cyclic epitaxial process may be used which enables facetless epitaxial growth of the Si:C film. Embodiments of the present invention also apply an in-situ doped epitaxial process which makes it possible to form true (or near) box-shape like carbon profiles that is generally desirable for applying stress. Alternatively, the epitaxial layer or film so formed may be doped through implantation which is then activated during the subsequent SPE process.

FIG. 1 is a demonstrative flow-chart illustration of a method of forming epitaxial silicon-carbon film according to one embodiment of the present invention. More specifically, the method discloses forming highly substitutional epitaxial silicon-carbon (Si:C) film (or layer) which may be used, as an example, in forming source and/or drain of an nFET transistor or embedded Si:C stressors in source and/or drain of an nFET transistor. The source and/or drain of the nFET transistor so formed may thus exert tensile stress towards the channel region of the nFET transistor for device performance enhancement.

More specifically, according to one embodiment and as being illustrated in the demonstrative flow-chart of FIG. 1, method 10 of present invention may include initially growing an epitaxial silicon-carbon film (or layer) (step 12) in a non-cyclic deposition process. The epitaxial growth may be performed at any appropriate temperature between, for example, 400 C and 900 C degrees and may preferably be at a temperature that is higher than those of conventional cyclic deposition processes, for example, above 600 C degrees. Unlike other conventional processes, at this initial Si:C film growth stage, embodiment of present invention does not try to or focus on achieving highly or fully substitutional Si:C film, which enables the use of higher growth temperature for faster growth rate and higher throughput. For example, the temperature used in this initial epitaxial growth may be above 600 C degrees, preferably between about 650 C and about 800 C degrees, which is higher than that used in a conventional cyclic deposition process which is normally below 600 C degrees.

According to one embodiment of present invention, the Si:C film may be formed in recesses created in a silicon substrate, surrounding a channel region of an nFET transistor, to function as source/drain of the nFET transistor or be used as embedded stressors in source/drain of the nFET transistor. The Si:C film may be formed below the channel level which is normally below the top surface of the substrate in a regular planar transistor device. However, a person skilled in the art may appreciate that embodiment of present invention is not limited in this aspect. For example, in forming an nFET transistor with raised source/drain, Si:C film may be formed above the top surface of the substrate to be adjacent to spacers that are formed next to the gate of the nFET transistor. In yet another embodiment, the Si:C film may be formed both below and above the top surface of the substrate. According to one embodiment, the higher temperature and non-cyclic deposition process enable the formation of facetless Si:C film particularly adjacent to areas interfacing with the spacers, at the substrate level and/or above the substrate level, which are often made of dielectric materials such as nitride or nitride-oxide. Facetless Si:C film enables the formation of low-resistant source/drain contacts later in the process by providing increased areas for forming contacts such as silicide contacts.

After forming epitaxial Si:C film, one embodiment of present invention includes performing amorphization of the formed Si:C film through a process known as amorphizing implantation (step 14). More specifically, the embodiment includes implanting ions of some chemical elements such as, for example, germanium (Ge), xenon (Xe), and/or silicon (Si) into and amorphizing the epitaxial Si:C film as a step in transforming the initial Si:C film into highly substitutional Si:C film. The implantation may also be cluster based or carbon-containing species based. The amorphizing implantation breaks the bonds between carbon (C) and silicon (Si).

Following the amorphization through implantation, one embodiment of present invention includes covering the Si:C film, at least in the source/drain regions, with a tensile stress liner (step 16) which may cover the gate of the nFET transistor as well. The tensile stress liner may be deposited through any known or future developed deposition techniques and preferable may be a conformal deposition process.

With the tensile stress liner covering both the gate and amorphized Si:C film in the source/drain regions, one embodiment of present invention includes performing a solid phase epitaxy process (step 18) which re-crystallizes the amorphized Si:C film in the source/drain regions into highly substitutional Si:C film. For example, the highly substitutional Si:C film may contain more than 1.5%, for example close to 2%, carbon in atomic concentration. As a result, the substitutional Si:C film, which has high carbon concentration in the source/drain regions, may act as stressors and exert tensile stress towards the channel region of the nFET transistor underneath the gate. According to one embodiment of present invention, the use of tensile stress liner helps reduce lattice mismatch between the channel region and the re-crystallized source/drain regions of the nFET transistor.

FIGS. 2-6 are demonstrative illustrations of cross-sectional views of a semiconductor structure during a process of manufacturing thereof according to embodiments of the present invention. In FIGS. 2-6, silicon-carbon film (or layer) formed according to various embodiments of present invention is demonstratively illustrated to be used as source/drain or embedded stressors in source/drain in connection with planar transistor devices. However, a person skilled in the art will appreciate that embodiments of present invention are not limited in this aspect, and silicon-carbon film (or layer) so formed may be used in other types of transistor devices such as, for example, fin-type field-effect-transistors or other 3-dimensional (3-D) transistor devices. More generally, silicon-carbon film (or layer) so formed may be used in any areas and/or field where highly substitutional silicon-carbon film, with at least 1.5% carbon in atomic concentration, may be desirable.

Figure 2:
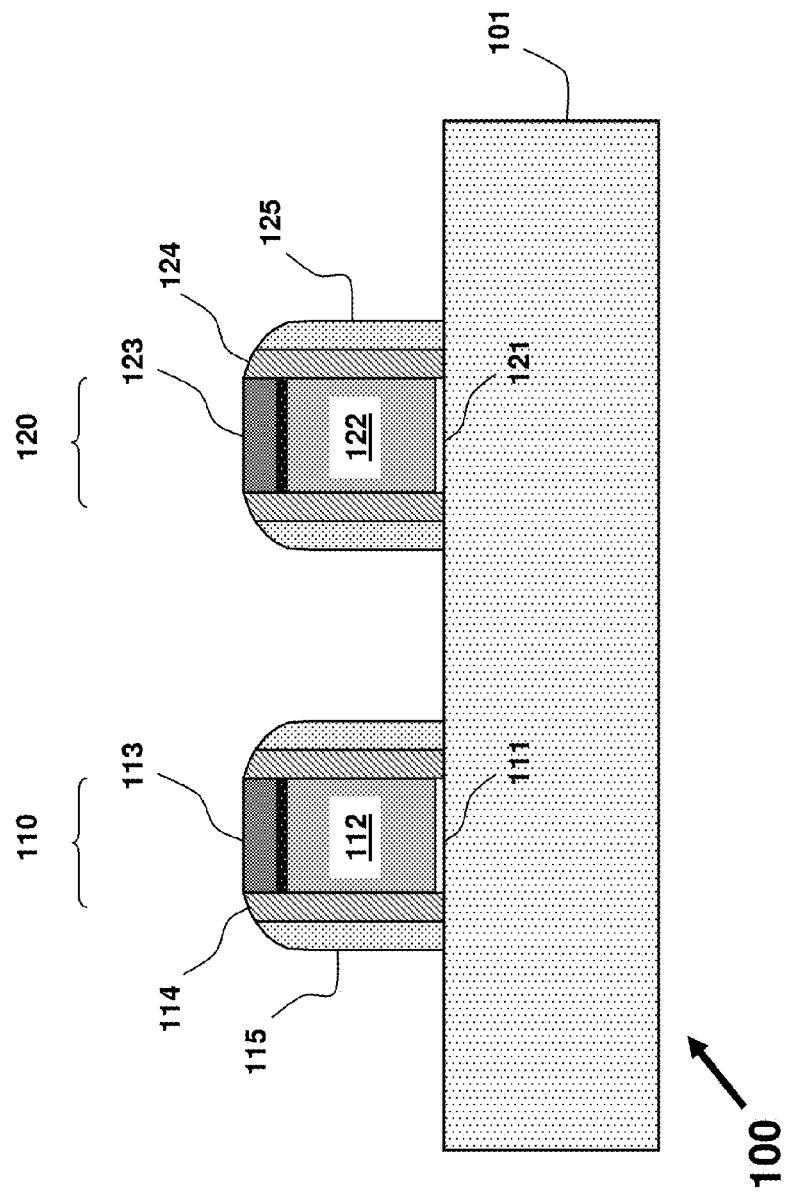
FIGS. 2-6 are demonstrative illustrations of cross-sectional views of a semiconductor structure during a process of manufacturing thereof according to embodiments of the present invention.

Specifically, FIG. 2 is a demonstrative illustration of a cross-sectional view of semiconductor structure 100, in a step of forming thereof according to one embodiment of the present invention. In one embodiment, the method may start with forming a plurality of gate structures of a plurality of corresponding planar transistors, such as gate structures 110 and 120 on top of a semiconductor substrate 101. More specifically, gate structure 110 may include gate dielectric layer 111, conductive (poly, metal, etc.) gate layer 112 on top of gate dielectric layer 111, and dielectric cap layer 113 (such as a nitride cap layer) covering conductive layer 112. Similarly, gate structure 120 may include gate dielectric layer 121, conductive gate layer 122, and dielectric cap layer 123. One or more sets of sidewall spacers, for example spacer sets of 114 and 115, may be formed at sidewalls of gate structure 110 and one or more set of spacers 124 and 125 may be formed at sidewall of gate structure 120. Here, it is to be noted that although two sets of spacers 114/115 (124/125) are illustrated in FIG. 2, embodiments of present invention are not limited in this aspect. For example, in one embodiment, one set of spacers may be required in forming the transistors and in another embodiment more than two sets of spacers may be used during the process of manufacturing. Embodiments of present invention contemplate to include all of such variations without deviating from the spirit of present invention.

Figure 3:
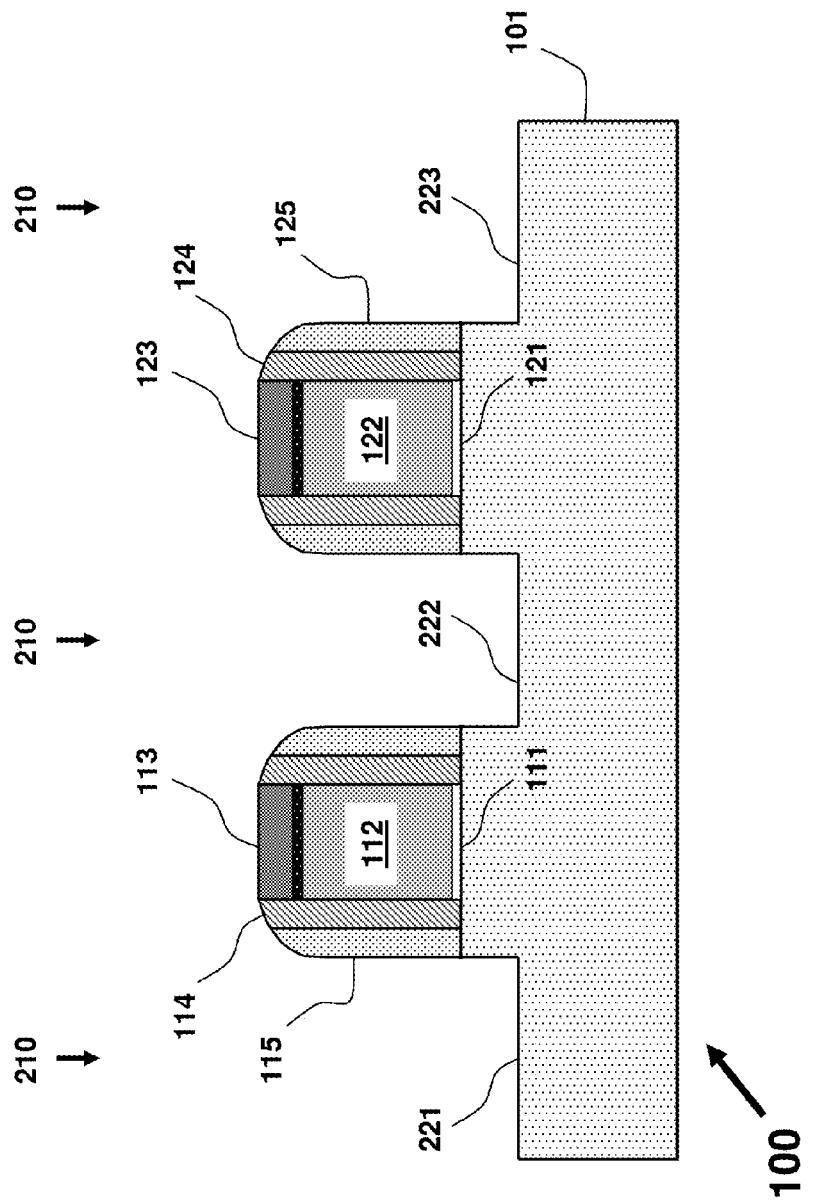

FIG. 3 is a demonstrative illustration of a cross-sectional view of semiconductor structure 100, in a step of forming thereof following the step shown in FIG. 2, according to one embodiment of the present invention. More specifically, in the demonstrative example of forming planar transistor devices as being illustrated in FIG. 3, one embodiment of present invention includes creating recesses 221, 222, and 223 in the source/drain regions of the transistors where Si:C stressors are to be formed or where source/drain with embedded stressors are to be formed. The recesses 221, 222, and 223 may be created through, for example, a reactive-ion-etching (RIE) process 210 which may directionally etch the silicon substrate 101 using sidewall spacers 115 and 125 as template with cap layers 113 and 123 covering the conductive gate 112 and 122. With the above process, recesses 221, 222, and 223 may be created to be self-aligned to the spacers 115 and 125. According to one embodiment, recesses 221, 222, and 223 may be created to be sufficient deep below the channel regions of transistors.

For semiconductor structure 100 that employs extremely thin silicon on insulator (ETSOI) or 3-D structures like Fin-FETs, the above step of forming recesses in substrate 101 may be optional because the majority of source/drain will be formed above the top surface level of substrate 101.

Figure 4:
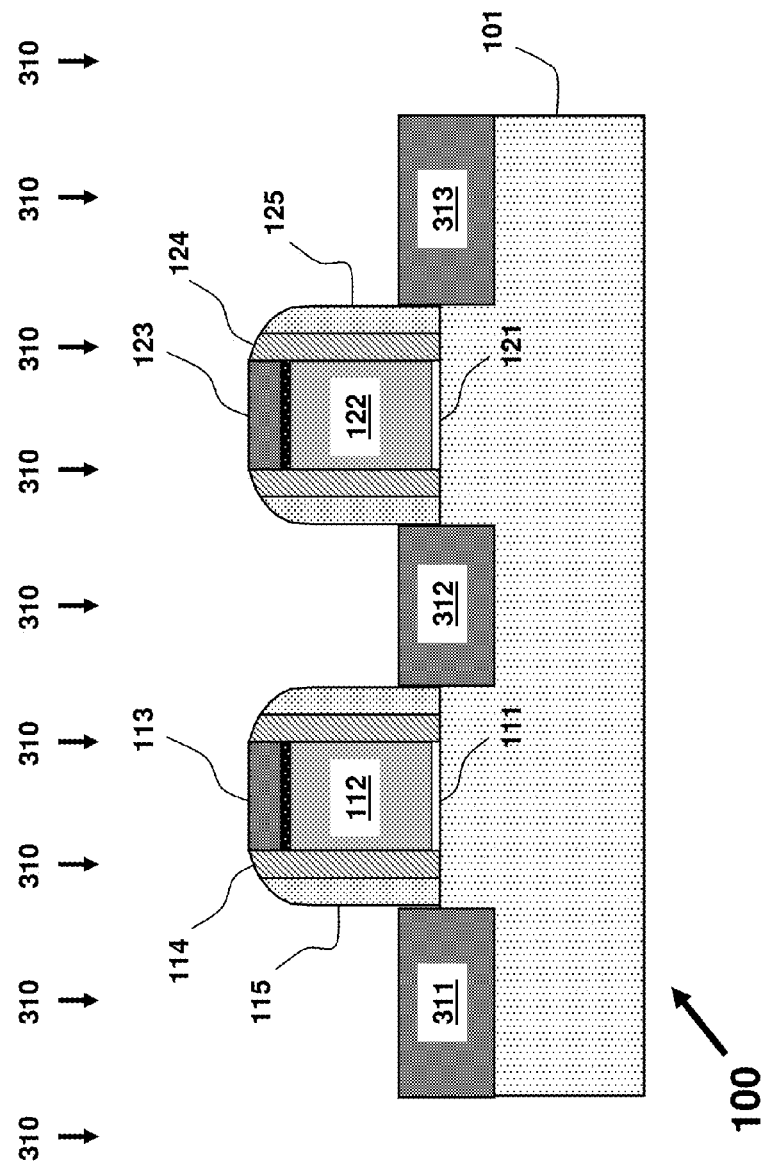

Following the formation of recesses in the source/drain regions or after defining source/drain regions as in other non-planar transistor devices, embodiments of present invention include a step of performing, preferably, a non-cyclic epitaxial growth of silicon-carbon film (or layer) in the source/drain regions, as being demonstratively illustrated in FIG. 4, and the epitaxial growth is preferably, although not necessarily, performed at a temperature that is higher than those of conventional epitaxial growth. For example, the epitaxial growth may be performed at a temperature range between about 400 C and about 900 C, but preferably between about 650 C and about 800 C. The epitaxial growth performed at a higher than conventional temperature allows a high growth rate of the Si:C film 311, 312, and 313 in the source/drain regions, and the use of non-cyclic deposition approach enables the growth of Si:C film 311, 312, and 313 in a facetless manner when it comes to interface with sidewall spacers such as at areas adjacent to sidewall spacers 115 and 125. In FIG. 4, silicon-carbon film 311, 312, and 313 are illustrated to be formed from below the top surface of semiconductor substrate 101 to above thereof, as a demonstrative example.

Following the non-cyclic epitaxial growth of Si:C film 311, 312, and 313, one embodiment of present invention includes a step of performing amorphizing implantation 310 in the epitaxially grown films 311, 312, and 313. More specifically, the method may include implanting ions of certain chemical elements such as, for example, germanium (Ge), xenon (Xe) and/or silicon (Si) to amorphize the epitaxial Si:C film before transforming the films into highly substitutional Si:C film. According to other embodiments of the present invention, other cluster based or carbon-containing species based implantation may be used as well for the amorphizing process. The amorphizing implantation process is a process that breaks at least partially bonds between carbon (C) and silicon (Si).

Figure 5:
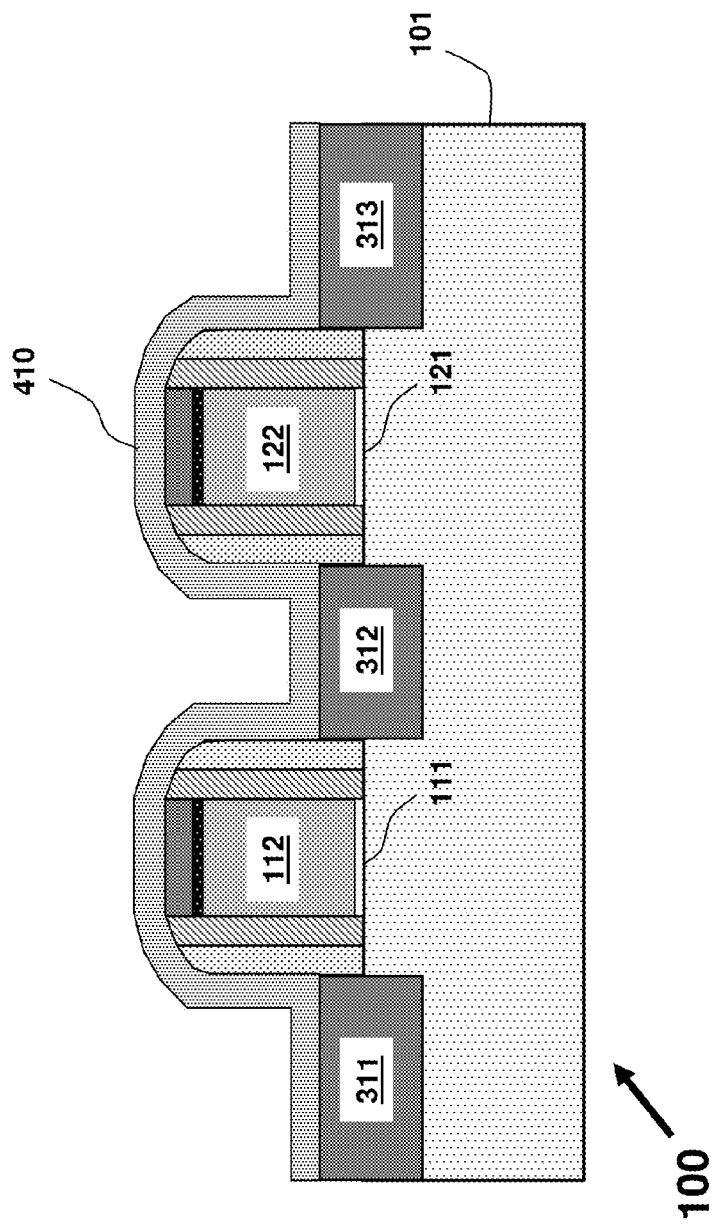

FIG. 5 is a demonstrative illustration of a cross-sectional view of semiconductor structure 100, in a step of forming thereof following the step shown in FIG. 4, according to one embodiment of the present invention. During this step, embodiment of present invention includes covering the Si:C film, at least in the source/drain regions, with a tensile stress liner 410. Tensile stress liner 410 may cover the gate of the nFET transistors as well. The use of tensile stress liner helps reduce lattice mismatch between the channel region and source/drain regions of the transistor during a follow-up step of solid phase epitaxy (SPE) process. Furthermore, any mismatch in lattice may be fine tuned or adjusted by the amount of tensile stress that tensile stress liner 410 exerts on the epitaxially grown source/drain regions 311, 312, and 313.

Tensile stress liner 410 may be a nitride liner, an oxide liner, an oxynitride liner, or made of other suitable dielectric material. Tensile stress liner may be deposited through any currently existing or future developed film deposition techniques, and may preferably be deposited through a conformal deposition process although non-conformal deposition may be used as well. In one embodiment, the tensile stress of stress liner 410 may be between about 1 GPa and about 5 GPa, and preferably between about 2 GPa and 4 GPa. The amount of tensile stress may be adjusted or tuned such as to improve or manipulate, if necessary, the matching of lattices between the silicon channel underneath the gate and the highly substitutional Si:C film in the source/drain regions of the nFET transistor, which is formed in a follow-up solid-phase epitaxy (SPE) step.

Figure 6:
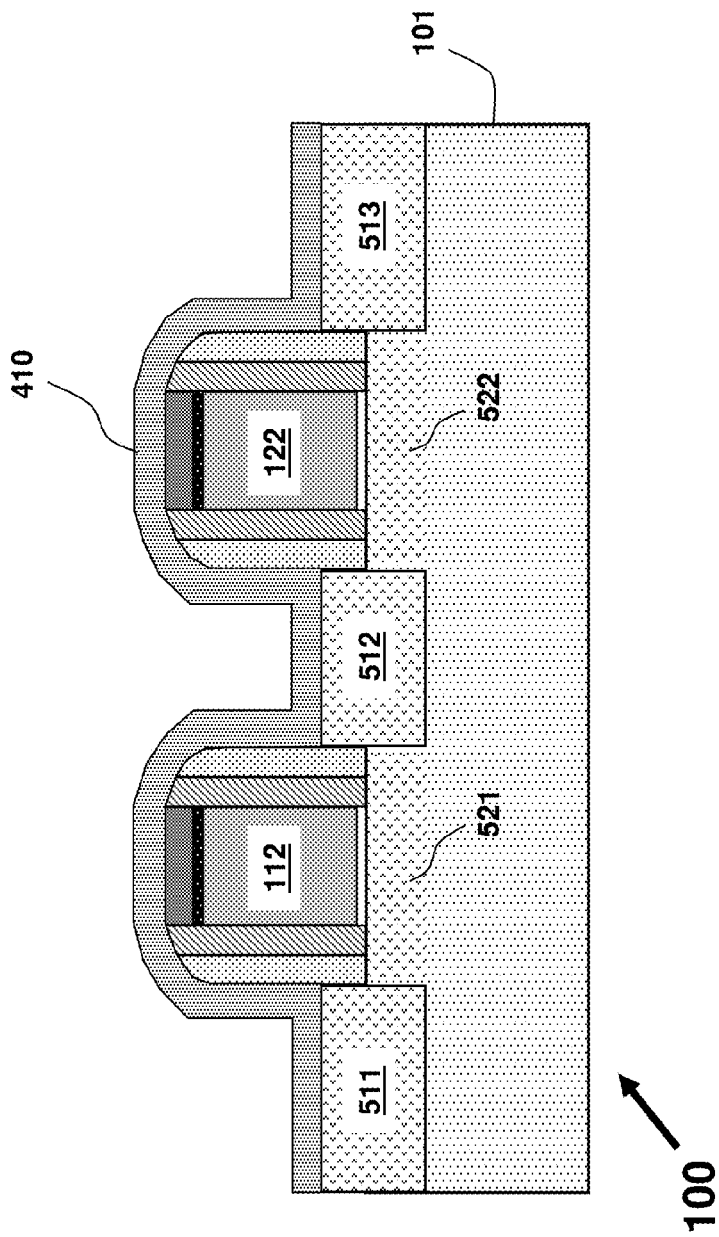

FIG. 6 is a demonstrative illustration of a cross-sectional view of semiconductor structure 100, in a step of forming thereof following the step shown in FIG. 5, according to one embodiment of the present invention. With tensile stress liner 410 covering the top surface of epitaxially grown Si:C source/drain regions 311, 312, and 313, one embodiment of present invention includes applying a solid phase epitaxial process to the transistor structure, in particular to the source/drain regions of Si:C films 311, 312, and 313. The SPE process may be performed, as one un-limiting example, at a temperature of around 600 degree C. and for a duration of approximately 30 second, which process re-crystallizes the amorphized Si:C film to transform it into a highly substitutional Si:C films 511, 512, and 513. Other SPE processes such as, for example, a conventional furnace anneal, a spike anneal in a RTP furnace, or a millisecond anneal using laser or flash anneal (performed at as high as 1350 C and as short as sub-millisecond) may be used as well to transform the amorphized Si:C film into a Si:C film with a high substitutional carbon concentration. For example, in one embodiment, the re-crystallized Si:C film may have a substitutional carbon concentration in the silicon atom place between about 1% and about 4%. However, embodiments of the present invention are not limited in this specific carbon concentration range, and other substitutional range of carbon concentration is also attainable by properly adjusting conditions of the SPE process and preceding epitaxial and implantation processes.

As being demonstratively illustrated in FIG. 6, re-crystallized source/drain regions 511, 512, and 513 may have a lattice constant that is relatively close to that in the silicon channel regions 521 and 522 of the nFET transistor in both vertical and out-of-plane directions. The matching in lattice between the channel region and source/drain regions, as being discussed above, may be properly adjusted by, for example, adjusting the amount of tensile stress that stress liner 410 may exerts on the channel region, and by tuning conditions during the SPE process.

Figure 7A:
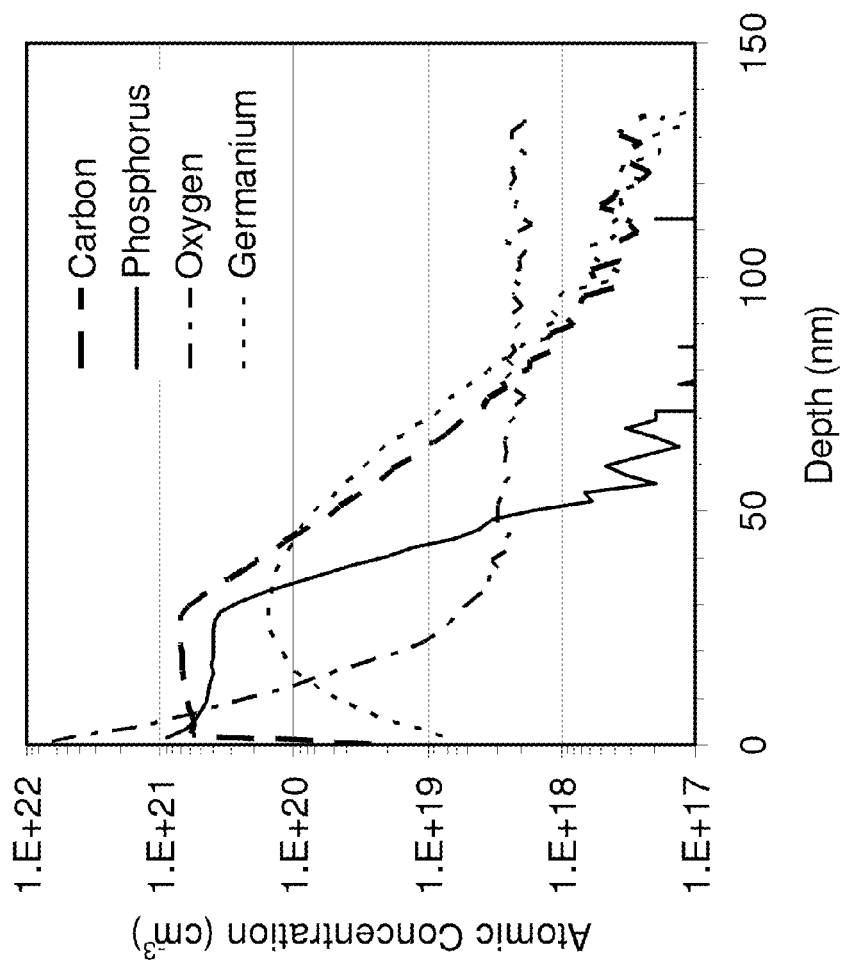
FIGS. 7(a) and 7(b) are sample charts of measurement of a semiconductor device which is formed according to one embodiment of the present invention.

FIGS. 7(a) and (b) are sample charts of measurement of a semiconductor device which is formed according to one embodiment of present invention. More particularly, FIG. 7(a) shows profiles obtained through secondary ion mass spectrometry (SIMS) from a non-cyclic SiCP (Si:C with in-situ phosphorus doping) epitaxial layer grown which is then followed by a 40 KeV Ge amorphization implant and laser anneal at a temperature of about 1250 degree C. FIG. 7(a) shows concentration levels of carbon, phosphorus, oxygen, and germanium along the thickness of the film formed. By curve fitting, it may be derived that the carbon (C) concentration level is around 1.3% when the film thickness is around 31 nm and in-situ phosphorus (P) concentration level is around 4E20 atoms/cm3. On the other hand, a separate sheet resistance measurement reveals that the resistance (Rs) is about 134.8 Ohm per square foot, which suggests a resistivity of around 0.42 mOhm-cm has been achieved.

Figure 7B:
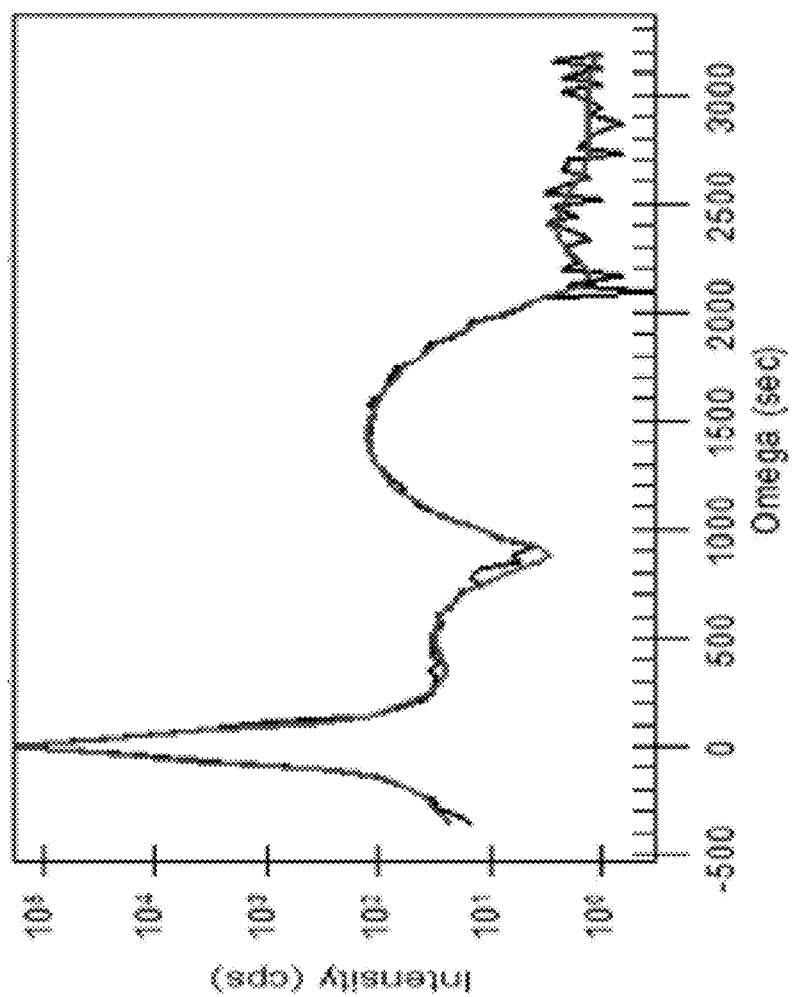

FIG. 7(b) shows a x-ray diffraction (XRD) profile, which characterizes the lattice mismatch, obtained from the same wafer, as above, demonstrating about 1.3% substitutional carbon incorporation or concentration. The location of the secondary peak (comes from Si:C layer) relative to the main peak (comes from Si) in XRD can be used to determine the lattice constant of Si:C and the substitutional carbon level. The image actually has both raw data and fitted data of 1.3% carbon. Since the SIMS analysis illustrated in FIG. 7(a) shows a chemical carbon concentration (total carbon) of ~1.35%, and the XRD analysis illustrated in FIG. 7(b) shows near 1.34% substitutional carbon level, formation of an almost fully substitutional Si:C film is experimentally verified.

Figure 8A:
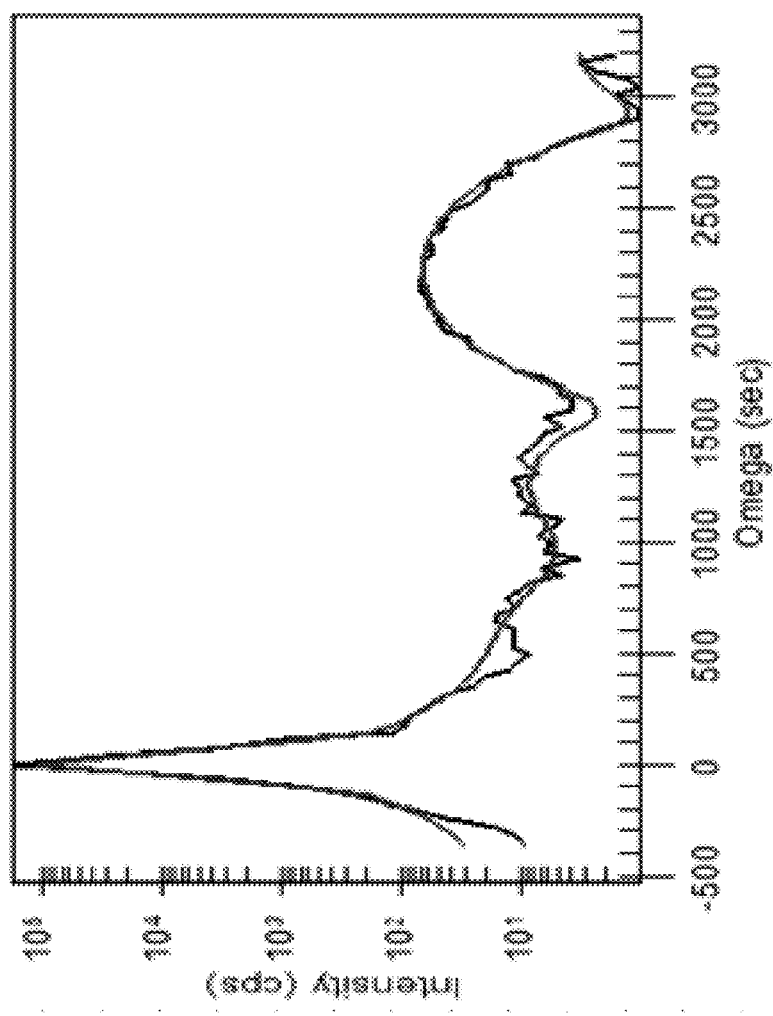
FIGS. 8(a) and 8(b) are sample charts of measurement of a semiconductor device which is formed according to one embodiments of the present invention.
Figure 8B:
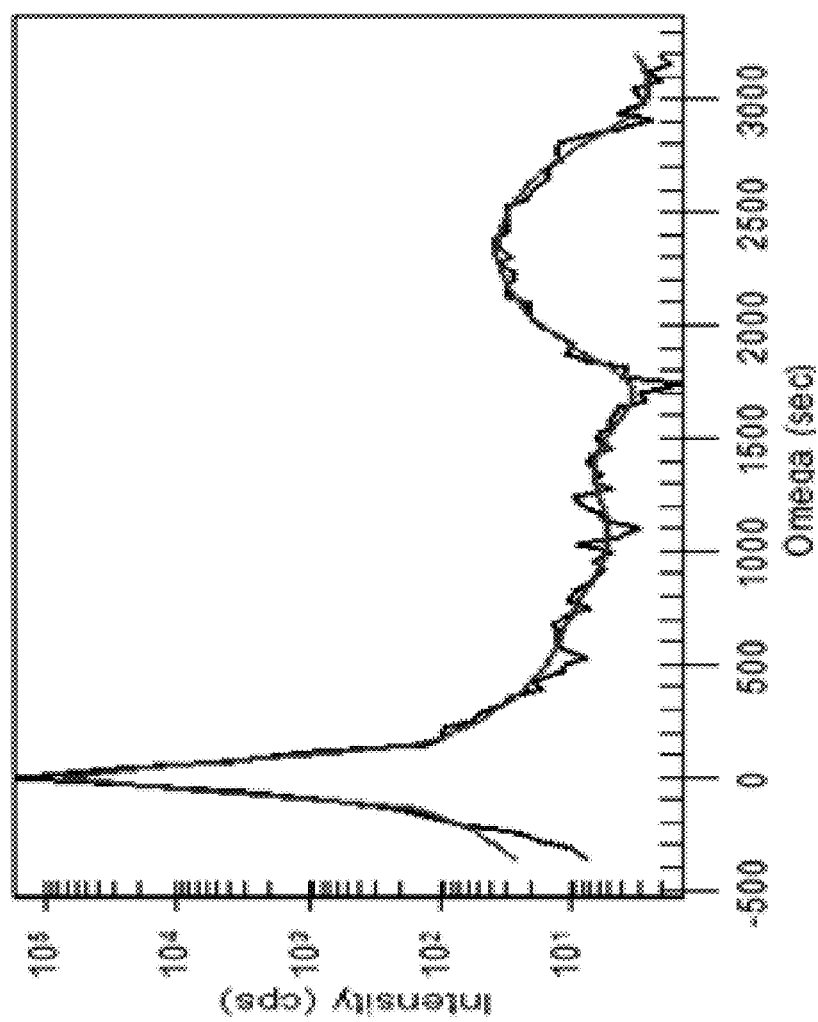

FIGS. 8(a) and (b) are sample charts of measurement of another semiconductor device formed according to embodiment of the present invention. In FIGS. 8(a) and (b), the two XRD profiles are illustrated with their respective fitting curves and are obtained from Si:C films of semiconductor devices that are manufactured according to embodiments of present invention and have been targeted to have, respectively, 2.0% and 2.4% total carbon concentration level. In reality, we have confirmed, experimentally as shown in FIG. 8(a), that for the film which was targeted for a 2.0% total carbon concentration, a film with about 1.98% substitutional carbon concentration, at a thickness of around 29 nm, was obtained which suggests the achievement of an almost full subsitutionality. Similarly, for the film whose XRD profile is shown in FIG. 8(b) and which had a targeted 2.4% total carbon concentration, the film actually was measured to have a 2.1% substitutional carbon concentration, suggesting a full substitutionality as well. The film had a thickness of approximately 29 nm.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
   providing a semiconductor substrate;
   epitaxially growing a silicon-carbon layer on top of said semiconductor substrate;
   amorphizing said silicon-carbon layer;
   covering said amorphized silicon-carbon layer with a stress liner; and
   subjecting said amorphized silicon-carbon layer to a solid phase epitaxy (SPE) process.

2. The method of claim 1, wherein said epitaxially growing a silicon-carbon layer comprises depositing said silicon-carbon layer in a non-cyclic process performed at a temperature higher than about 600 C degrees.

3. The method of claim 2, wherein said silicon-carbon layer is deposited at a temperature range between about 650 C and about 800 C degrees.

4. The method of claim 1, wherein said amorphizing said silicon-carbon layer comprises breaking bonds between carbon (C) and silicon (Si) through ion-implantation, wherein ions implanted during said amorphizing comprise at least one of germanium (Ge), xenon (Xe), and silicon (Si).

5. The method of claim 1, wherein subjecting said amorphized silicon-carbon layer to said SPE process comprises exposing said silicon-carbon layer, while being covered by said stress liner, to a thermal annealing process at a temperature of approximately 600 degree C. that lasts for about 30 seconds.

6. The method of claim 1, wherein subjecting said amorphized silicon-carbon layer to said SPE process re-crystallizes said silicon-carbon layer and results in a highly substitutional silicon-carbon film having a carbon atomic concentration of larger than 1.5%.

7. A method of forming a field-effect-transistor comprising:
   providing a semiconductor substrate;
   forming a gate structure of said field-effect-transistor on top of said semiconductor substrate, said gate structure having nitride spacers at sidewalls thereof;
   creating recesses in said semiconductor substrate next to said gate structure adjacent to said nitride spacers;
   epitaxially growing a silicon-carbon layer in said recesses;
   amorphizing said silicon-carbon layer;
   covering said amorphized silicon-carbon layer with a stress liner; and
   subjecting said amorphized silicon-carbon layer to a solid phase epitaxy (SPE) process.

8. The method of claim 7, wherein said epitaxially growing a silicon-carbon layer comprises depositing said silicon-carbon layer in a non-cyclic process, said depositing being performed at a temperature higher than 600 C degrees.

9. The method of claim 8, wherein said silicon-carbon layer is deposited at a temperature range between about 650 C and about 800 C degrees.

10. The method of claim 7, wherein said silicon-carbon layer is grown to have a height higher than a top surface level of said semiconductor substrate, being adjacent to said nitride spacers of said gate structure, and forming raised source/drain of said field-effect-transistor.

11. The method of claim 10, wherein said silicon-carbon layer is grown to be facetless in areas adjacent to said nitride spacers.

12. The method of claim 7, wherein amorphizing said silicon-carbon layer comprises breaking bonds between carbon (C) and silicon (Si) through ion-implantation, wherein ions used in said implantation comprise at least one of germanium (Ge), xenon (Xe), and silicon (Si).

13. The method of claim 7, wherein subjecting said amorphized silicon-carbon layer to said SPE process comprises exposing said silicon-carbon layer to a thermal annealing environment for about 30 seconds at a temperature of approximately 600 C degrees, while said silicon-carbon layer being covered by said stress liner.

14. The method of claim 7, wherein subjecting said amorphized silicon-carbon layer to said SPE process transforms said amorphized silicon-carbon layer into a highly substitutional Si:C film which has at least 1.5% carbon atomic concentration.

15. A method of forming a field-effect-transistor comprising:
   providing a semiconductor substrate;
   forming at least one gate structure on top of said semiconductor substrate, said at least one gate structure having at least one set of spacers at sidewalls thereof, said at least one set of spacers being adjacent to source/drain regions of said field-effect-transistor;
   epitaxially growing a silicon-carbon layer on top of said semiconductor substrate;
   amorphizing said silicon-carbon layer;
   depositing a stress liner covering said amorphized silicon-carbon layer; and
   subjecting said amorphized silicon-carbon layer to a thermal annealing process.

16. The method of claim 15, wherein said epitaxially growing a silicon-carbon layer comprises depositing said silicon-carbon layer in a non-cyclic process, said depositing being performed at a temperature between about 650 C and about 800 C degrees.

17. The method of claim 15, wherein said silicon-carbon layer is grown to have a height higher than a top surface level of said semiconductor substrate, being adjacent to said at least one set of spacers of said gate structure, and forming source/drain of said field-effect-transistor.

18. The method of claim 17, wherein said silicon-carbon layer is facetless in areas adjacent to said at least one set of spacers.

19. The method of claim 15, wherein subjecting said amorphized silicon-carbon layer to said thermal annealing process comprises exposing said silicon-carbon layer to an environment of a temperature of about 600 degree C. for about 30 second duration, while said silicon-carbon layer being covered by said stress liner, wherein said stress liner is conformally deposited to cover said at least one gate structure as well.

20. The method of claim 15, wherein said stress liner is a tensile nitride liner having a tensile stress between about 2 GPa and about 4 GPa.

* * * * *